United States Patent [19]

Nakatani et al.

[11] Patent Number: 4,710,680

[45] Date of Patent: Dec. 1, 1987

[54] DRIVER DEVICE MOUNTING FOR A FLAT MATRIX DISPLAY PANEL

[75] Inventors: Hiroshi Nakatani, Tenri; Hirokazu Yoshida, Osaka; Keiji Yamamura, Takaichi, all of Japan

[73] Assignee: Sharp Kabushiki Kaisha, Osaka, Japan

[21] Appl. No.: 30,256

[22] Filed: Mar. 24, 1987

Related U.S. Application Data

[63] Continuation of Ser. No. 640,563, Aug. 14, 1984, abandoned.

[30] Foreign Application Priority Data

Aug. 24, 1983 [JP]  Japan ................ 58-155279

[51] Int. Cl.$^4$ ............................................. G09G 3/10
[52] U.S. Cl. ............................. 315/169.4; 315/169.2; 350/333
[58] Field of Search ......................... 315/169.2, 169.4; 350/332, 333

[56] References Cited

U.S. PATENT DOCUMENTS

| | | |
|---|---|---|
| 4,051,408 | 9/1977 | Albertine, Jr., et al. .... 315/169.4 X |
| 4,247,590 | 1/1981 | Hayakawa et al. ............. 428/210 |
| 4,280,132 | 7/1981 | Hayakawa et al. ............. 357/80 |
| 4,300,153 | 11/1981 | Hayakawa et al. ............. 357/80 |
| 4,333,040 | 6/1982 | Okamoto et al. ............. 315/169.2 |
| 4,447,131 | 5/1984 | Soma .............................. 350/333 |

Primary Examiner—Saxfield Chatmon
Attorney, Agent, or Firm—Birch, Stewart, Kolasch & Birch

[57] ABSTRACT

A flat matrix display panel includes a plurality of scanning electrodes, and a plurality of data electrodes formed in a matrix fashion. The data electrodes are divided into two groups, one having terminals on the upper edge of the panel, and the other having terminals on the bottom edge of the panel. A first group data driver LSI is mounted on a substrate in a face-up bonding manner, and is connected to the terminals formed on the upper edge of the panel. A second group data driver LSI, which has the same construction as the first group data driver LSI, is mounted on the same side of the substrate in a facedown bonding manner, and is connected to the terminals formed on the bottom edge of the panel.

2 Claims, 12 Drawing Figures

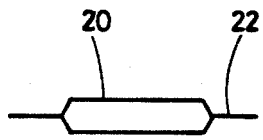 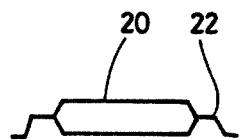 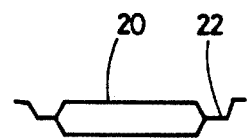
FIG.2(A)   FIG.2(B)   FIG.2(C)
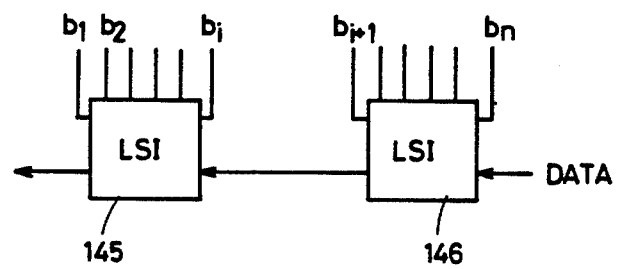
FIG.3
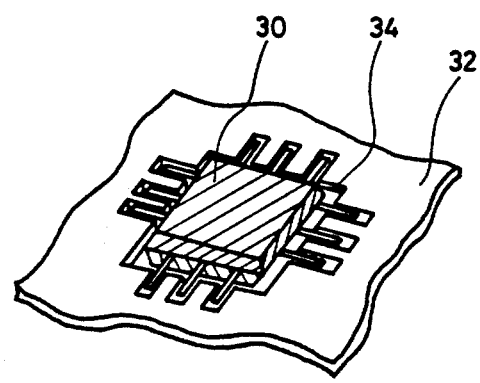
FIG.4
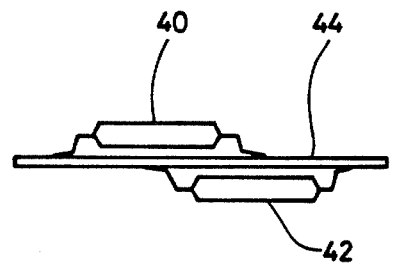
FIG.5

DRIVER DEVICE MOUNTING FOR A FLAT MATRIX DISPLAY PANEL

This application is a continuation of application Ser. No. 640,563, filed on Aug. 14, 1984, now abandoned.

BACKGROUND OF THE INVENTION

Field of the Invention

The present invention relates to a mounting method for a device which drives a flat matrix display panel.

DESCRIPTION OF THE PRIOR ART

A flat matrix display panel generally includes matrix shaped electrodes. More specifically, the panel includes hundreds of Y-electrodes (data side) and hundreds of X-electrodes (scanning side). Each electrode must be connected to a driver circuit which is normally implemented with an LSI. Each of the driver outputs of the LSI must be connected to the corresponding one of the hundreds of electrodes formed in the flat matrix display panel. Because of the large number of the electrodes formed in the flat matrix display panel, half of the X-electrodes (or the Y-electrodes) are led out on one edge of the flat matrix display panel, and the remaining half of the X-electrodes (or the Y-electrodes are led out on the opposing edge of the flat matrix display panel. In such a flat matrix display panel, when the same LSIs are used as the driver circuits disposed on both edges of the flat matrix display panel, the data transfer direction on one edge is in reverse order to the order of the electrodes formed on the flat matrix display panel. In the conventional system, the crossed wiring is provided between the LSI drivers and the flat matrix display panel at one edge of the flat matrix display panel. The crossed wiring occupies a large space and creates noises. In another conventional system, LSIs of the first type are disposed on one edge of the flat matrix display panel. LSIs, of the second type which have the output terminals symmetrically mirrored to the first type LSIs, are disposed on the opposing edge of the flat matrix display panel. In this case, two types of LSIs are required for the driver circuit connected to the X-electrodes (Y-electrodes) and, therefore, the cost of the driver circuit becomes high.

OBJECTS AND SUMMARY OF THE INVENTION

Objects of the Invention

Accordingly, an object of the present invention is to provide a novel mounting method for mounting driver LSIs on a substrate associated with a flat matrix display panel.

Another object of the present invention is to provide a mounting method of driver LSIs, which minimizes the system size.

Still another object of the present invention is to provide a flat matrix display panel system having driver LSIs mounted on a film substrate connected to at least three edges of the flat matrix display panel.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

SUMMARY OF THE INVENTION

To achieve the above objects, pursuant to an embodiment of the present invention, a flat matrix liquid crystal dispaly panel has matrix shaped Y-electrodes (data electrodes) and X-electrodes (scanning electrodes). Half of the Y-electrodes have terminals on the upper edge of the flat matrix liquid crystal display panel, and the remaining half of the Y-electrodes have terminals on the bottom edge of the flat matrix liquid crystal display panel. A first driver LSI is mounted by the face-up bonding method on a circuit substrate connected to the terminals formed on the upper edge of the flat matrix liquid crystal display panel. A second driver LSI having the same construction as the first driver LSI is mounted by the face-down bonding method on a circuit substrate connected to the terminals formed on the bottom edge of the flat matrix liquid crystal display panel.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIGS. 2(A) through 2(C) are schematic front views of flat packages employed in a conventional flat matrix display panel system;

FIG. 3 is a schematic plan view of an LSI mounting in the conventional flat matrix display panel system;

FIG. 4 is a perspective view showing an LSI mounting condition in the conventional flat matrix display panel system;

FIG. 5 is a schematic front view showing an LSI mounting condition in the conventional flat matrix display panel system;

DESCRIPTION OF THE PREFERRED EMBODIMENTS

Figure 1:
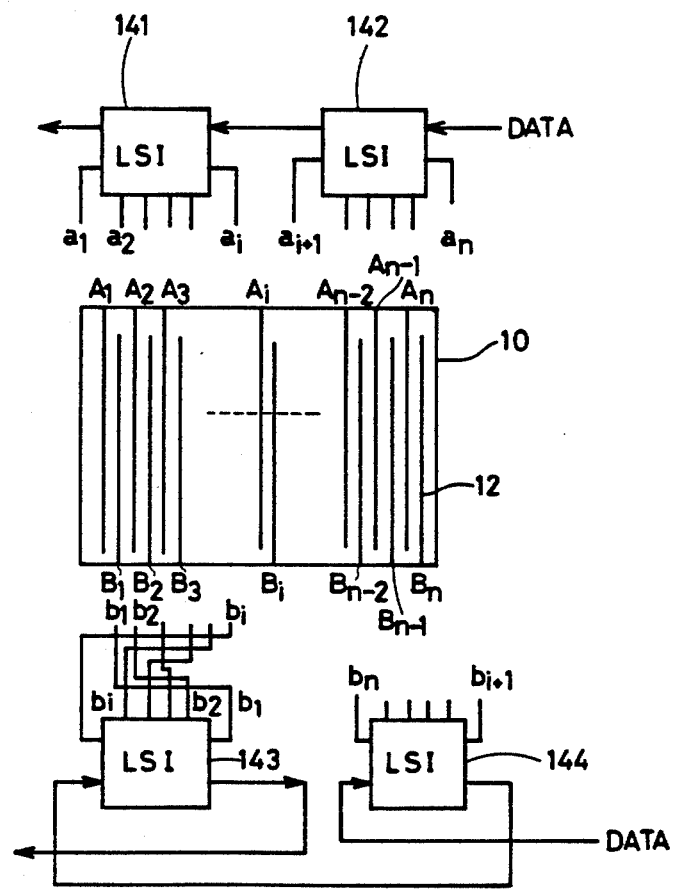
FIG. 1 is a block diagram of a conventional flat matrix display panel system.

FIG. 1 shows an example of the conventional flat matrix display panel system. A flat matrix display panel 10, for example, a liquid crystal matrix display panel, includes a plurality of Y-electrodes (data electrodes) 12 and a plurality of X-electrodes (scanning electrodes) (not shown). The data electrodes are divided into two groups $A_1$ through $A_n$ and $B_1$ through $B_n$. The electrodes $A_1$ through $A_n$ are extended toward the upper edge of the flat matrix display panel to form terminals, and the electrodes $B_1$ through $B_n$ are extended toward the bottom edge of the flat matrix display panel to form opposing terminals. Now assume that data side driver LSIs 141, 142, 143 and 144 have the same construction. The data side driver LSIs 141 and 152 to be connected to the electrodes $A_1$ through $A_n$ are aligned in the order corresponding to the electrodes $A_1$ through $A_n$. That is, the data transfer between the driver LSIs 141 and 142 is easily conducted by a simple wiring. Further, the order of output terminals $a_1$ through $a_i$ of the driver LSI 141 and the order of output terminals $a_{i+1}$ through $a_n$ of the driver LSI 142 are identical with the order of the data electrodes $A_1$ through $A_n$ of the flat matrix display panel 10. Accordingly, the connection wiring is easily formed at the upper edge of the flat matrix display panel 10. However, the data transfer direction between the driver LSIs 143 and 144 is reverse to the alignment of the driver LSIs 141 and 142. Further, the order of output terminals $b_1$ and $b_i$ of the driver LSI 143 and the order of output terminals $b_{i+1}$ through $b_n$ of the driver LSI 144 are reverse to the order of the data electrodes $A_1$ through $A_n$ of the flat matrix display panel 10. Therefore, a number of crossings and reversely parallel wirings are required at the side of the bottom edge of the flat matrix display panel 10. These wirings occupy a large space. Moreover, there is a possibility that noises are created due to the complicated wirings when the data transfer is conducted at several megahertz in shift registers.

To minimize the above-mentioned problems, several methods have been proposed. The following are examples of the proposed improvements.

(1) The driver LSI is housed in a flat package 20 as shown in FIG. 2(A). Lead terminals 22 of the flat package 20 are shaped in a desired configuration as shown in FIGS. 2(B) and 2(C). More specifically, the flat package 20 shown in FIG. 2(B) is used as the driver LSIs 141 and 142 and positioned at the upper edge of the flat matrix display panel 10. If the flat package 20 shown in FIG. 2(C) is used as driver LSIs 145 and 146 positioned at the bottom edge of the flat matrix display panel 10, the wiring becomes simple as shown in FIG. 3.

The crossings of the wiring can be omitted. However, the flat package requires a considerably large space.

(2) The driver LSI is housed in a flat package 30 as shown in FIG. 4. A circuit substrate 32 is provided with an aperture 34 formed therein in a shape corresponding to the flat package 30. The flat package 30 is accommodated in the aperture 34 as shown in FIG. 4. The crossing of the wiring can be omitted as in the method of proposal (1). The lead terminal shaping is not required. However, as in the case of the method (1), the flat package occupies a considerably large space.

(3) Packages 40 and 42 of the same construction are used. The LSI package 40 is connected to the wiring formed on a front surface of a circuit substrate 44. The LSI package 40 functions as one of the driver LSIs 141 and 142. The LSI package 42 is connected to the wiring formed on the rear surface of the circuit substrate 44 as shown in FIG. 5. The LSI package 42 functions as one of the driver LSIs 143 and 144. The through hole connectors must be provided for each of the terminals associated with the LSI package 42 so that the flat matrix display panel 10 is connected to the wiring patterns formed on one major surface of the circuit substrate. Therefore, the circuit substrate becomes complicated, and occupies a large space.

(4) The construction of the driver LSIs 143 and 144 is a symmetrical mirror image to the construction of the driver LSIs 141 and 142. That is, two kinds of LSIs are manufactured. The manufacturing cost becomes high. If the LSI is housed in the flat package, the flat package occupies a large space.

The present invention is to minimize the above-mentioned defects of the conventional systems. That is, the present invention is to provide a system of a minimum size. Further, the same LSIs can be used on both edges without the through hole connections in accordance with the present invention. The wirings between the driver LSIs and the flat matrix display panel is simplified.

In accordance with an embodiment of the present invention, a plurality of Y-electrodes (data electrodes) and a plurality of X-electrodes (scanning electrodes) are formed in a matrix fashion in a flat matrix display panel such as a liquid crystal matrix display panel. At least the X-electrodes or the Y-electrodes are divided into two groups. In a preferred form, the Y-electrodes 12 are divided into two groups ($A_1$ through $A_n$, and $B_1$ through $B_n$) as in the case of the system shown in FIG. 1. The LSI is first assembled on a tape carrier, and the thus formed tape carried LSI is bonded directly on a circuit substrate through the use of the tape automated bonding technique. The tape automated bonding technique is set forth in detail in U.S. Pat. Nos. 4,247,590, 4,300,153, and 4,280,132, assigned to the assignee of the present invention. The disclosures of these patents are, therefore, incorporated herein by reference.

Figures 6, 7:
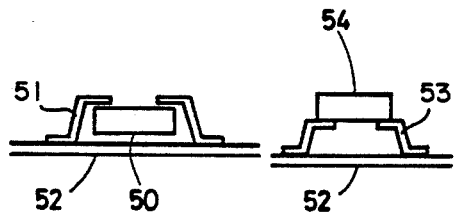
FIG. 6 is a schematic sectional view of an example of a mounting condition related to the mounting method of the present invention.
FIG. 7 is a schematic sectional view of another example of a mounting condition related to the mounting method of the present invention.

More specifically, a driver LSI 50 (corresponding to one of the driver LSIs 141 and 142 in FIG. 1) having leads 51 is mounted on a circuit substrate 52 by the face-up bonding method as shown in FIG. 6. Another driver LSI 54 (corresponding to one of the driver LSIs 143 and 144 in FIG. 1) having leads 53 is mounted on the same side of the circuit substrate 52 by the face-down bonding method as shown in FIG. 7. With this arrangement, no crossings of the wirings between the LSIs and between the LSI and the flat matrix display panel are provided on any edge of the flat matrix display panel.

Figures 8, 9:
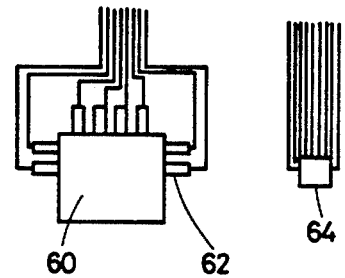
FIG. 8 is a schematic plan view of still another example of a mounting condition related to the mounting method of the present invention.
FIG. 9 is a schematic plan view of yet another example of a mounting condition related to the mounting method of the present invention.

FIG. 8 schematically shows the mounting condition related to the flat package. FIG. 9 schematically shows the mounting condition related to the tape automated bonding technique. A plastic flat package or a ceramic flat package 60 has electrode terminals 62 of which the pitch is considerably longer than the electrode terminal pitch of the flat matrix display panel. Accordingly, the wirings between the flat package 60 and the flat matrix display panel should be formed in a manner as shown in FIG. 8. An LSI 64 formed by the tape automated technique has the lead electrode pitch similar to the electrode terminal pitch of the flat matrix display panel. Therefore, the wiring between the LSI 64 and the flat matrix display panel is simplified as shown in FIG. 9.

Figure 10:
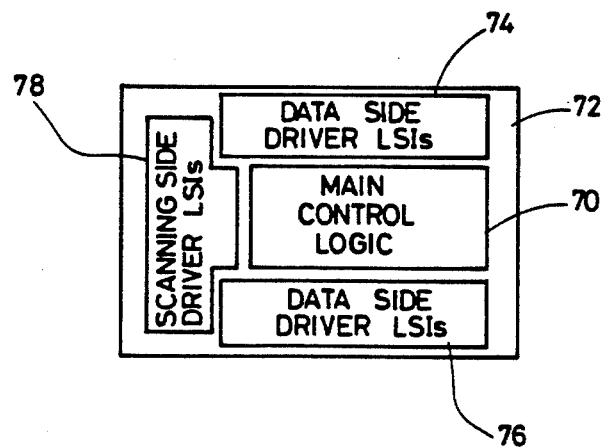
FIG. 10 is a schematic plan view of an embodiment of a circuit substrate employed in a flat matrix display panel system of the present invention.

When the driver circuits are disposed at the back of the flat display panel, an arrangement shown in FIG. 10 is preferable. That is, a main control logic LSI 70 (or LSIs 70) is mounted at the center of a substrate 72. A plurality of data side driver LSIs 74 are mounted along one edge of the substrate 72 through the use of the tape automated bonding technique. The LSIs 74 are connected to the data electrodes $A_1$ through $A_n$ (see FIG. 1). Other data side driver LSIs 76 are mounted along the opposing edge of the substrate 72 through the use of the tape automated bonding technique. The LSIs 76 are connected to the data electrodes $B_1$ through $B_n$ (see FIG. 1). A plurality of scanning side driver LSIs 78 are mounted along one of the remaining edges of the substrate 72. In a preferred form, the LSIs 74 are mounted on the substrate 72 in the face-up bonding manner, and the LSIs 76 are mounted on the substrate 72 in the facedown bonding manner.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A flat matrix display panel system comprising:
   a flat matrix display panel including a plurality of X-electrodes and a plurality of Y-electrodes, said plurality of Y-electrodes being divided into first and second groups having first terminals formed along a first edge of said flat matrix display panel and second terminals formed along a second opposing edge of said display panel respectively;
   a circuit substrate;
   an X-electrode driver LSI mounted on a first major surface of said circuit substrate;
   a first Y-electrode driver LSI mounted on said first major surface of said circuit substrate by a face-up bonding of a tape automated bonding technique, said first Y-electrode driver LSI being connected to said first terminals formed along said first edge of said flat matrix display panel; and
   a second Y-electrode driver LSI mounted on said first major surface of said circuit substrate by a face-down bonding of the tape automated bonding technique, said second Y-electrode driver LSI being connected to said second terminals formed along said second opposing edge of said flat matrix display panel.

2. The flat matrix diaplay panel system of claim 1, wherein
   said flat matrix display panel is a liquid crystal matrix display panel,
   said X-electrodes are scanning electrodes, and said Y-electrodes are data electrodes.

* * * * *